United States Patent
Broadway

(10) Patent No.: US 9,601,391 B2
(45) Date of Patent: Mar. 21, 2017

(54) MECHANICAL STRESS MEASUREMENT DURING THIN-FILM FABRICATION

(71) Applicant: The United States of America as Represented by the Administrator of the National Aeronautics and Space Administration, Washington, DC (US)

(72) Inventor: David M. Broadway, Lacey's Spring, AL (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/645,994

(22) Filed: Mar. 12, 2015

(65) Prior Publication Data
US 2016/0268173 A1 Sep. 15, 2016

(51) Int. Cl.
| | |
|---|---|
| *H01L 21/66* | (2006.01) |
| *C23C 16/44* | (2006.01) |
| *C23C 16/458* | (2006.01) |
| *C23C 16/56* | (2006.01) |
| *C23C 14/58* | (2006.01) |
| *C23C 14/50* | (2006.01) |

(Continued)

(52) U.S. Cl.
CPC .............. *H01L 22/12* (2013.01); *C23C 14/50* (2013.01); *C23C 14/52* (2013.01); *C23C 14/5806* (2013.01); *C23C 16/44* (2013.01); *C23C 16/458* (2013.01); *C23C 16/56* (2013.01); *G01B 11/16* (2013.01); *G01B 11/255* (2013.01)

(58) Field of Classification Search
CPC ....... H01L 22/12; H01L 21/66; C23C 16/458; C23C 16/56; C23C 14/50; C23C 14/22; C23C 14/5806; C23C 16/44
See application file for complete search history.

(56) References Cited

U.S. PATENT DOCUMENTS 5,745,240 A * 4/1998 Frakso .................... C23C 14/54
118/712
6,750,958 B1 6/2004 Fantone et al.
(Continued)

OTHER PUBLICATIONS

Marc Legros, In Situ Deformation of Thin Films on Substrates, Microscopy Research and Technique, Mar. 2009, 270-283, vol. 72, Issue 3, Wiley-Liss, Inc., Toulouse, France.

*Primary Examiner* — Selim Ahmed
(74) *Attorney, Agent, or Firm* — Peter J. Van Bergen; James J. McGroary

(57) ABSTRACT

A method and system are provided for determining mechanical stress experienced by a film during fabrication thereof on a substrate positioned in a vacuum deposition chamber. The substrate's first surface is disposed to have the film deposited thereon and the substrate's opposing second surface is a specular reflective surface. A portion of the substrate is supported. An optical displacement sensor is positioned in the vacuum deposition chamber in a spaced-apart relationship with respect to a portion of the substrate's second surface. During film deposition on the substrate's first surface, displacement of the portion of the substrate's second surface is measured using the optical displacement sensor. The measured displacement is indicative of a radius of curvature of the substrate, and the radius of curvature is indicative of mechanical stress being experienced by the film.

14 Claims, 3 Drawing Sheets

(51) Int. Cl.
*C23C 14/52* (2006.01)
*G01B 11/255* (2006.01)
*G01B 11/16* (2006.01)

(56) References Cited

U.S. PATENT DOCUMENTS

| | | |
|---|---|---|
| 7,418,353 B2 | 8/2008 | Lovell et al. |
| 8,625,083 B2 | 1/2014 | Roberts et al. |
| 2006/0241891 A1* | 10/2006 | Kaushal ............ H01L 21/67248 702/136 |

* cited by examiner

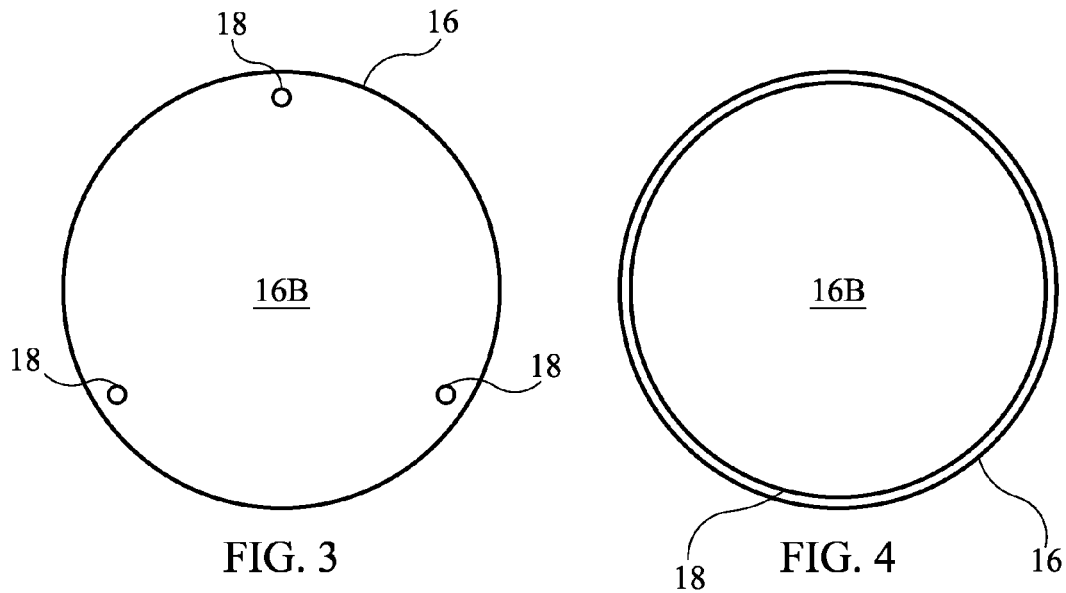
FIG. 3
FIG. 4
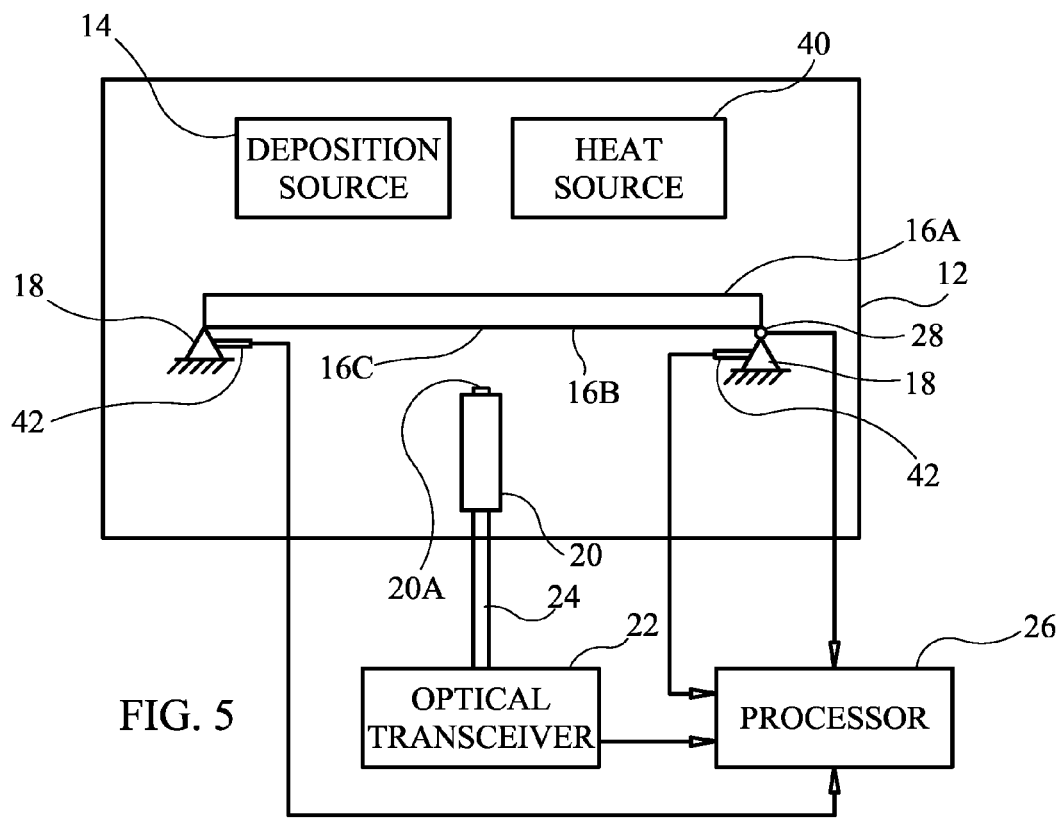
FIG. 5

MECHANICAL STRESS MEASUREMENT DURING THIN-FILM FABRICATION

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

1. Field of the Invention

This invention relates to measuring mechanical stress in thin films. More specifically, the invention is a method and system for measuring mechanical stress in a thin film during thin-film fabrication to include film deposition and thermal annealing processes.

2. Description of the Related Art

Control of residual stress in substrate-supported thin films has historically presented challenges in the fabrication of thin-film sensors, devices, and optics utilizing substrate-supported thin films. The stress can cause buckling or cracking of the film, delamination from the substrate, and/or substrate deformation. Measurement and control of thin-film stress is necessary for the successful fabrication of thin-film-based devices (e.g., semiconductors, optics, etc.) used in the fields of chemistry, mechanics, magnetics, and electricity.

Stress-induced deformation is of particular concern in the fabrication of reflective focusing and collimating X-ray optics used is a broad range of application-specific devices to include medical imagers and space telescopes. Briefly, the stress experienced by a device's thin-film elements can alter the precise geometrical figure of a thin-film supporting substrate thereby degrading the device's focusing or collimating properties. A thin-film reflective coating can be composed of a single-layer metal film, or hundreds of alternating angstrom-scale multilayered material pairs (known as X-ray multilayers in the art). For X-ray optics that utilize multilayer coatings, the negative impact to the overall optical performance resulting from thin-film stress-induced figure errors is two-fold in comparison to single-layer films. Briefly, multilayer coatings are designed so that a maximum in reflectivity occurs at a precise grazing incidence angle for a given substrate geometry and photon energy according to the Bragg condition. Therefore, stress-induced substrate deformation can cause an effective change in the optic's designed grazing incidence angle that, in turn, can cause a significant reduction in the focusing or collimating properties and the X-ray reflectivity.

For most thin-film deposition techniques, the stress experienced by the thin film and substrate is highly process dependent and can be minimized to various degrees depending on material composition through the optimization of the many process parameters. Since thin-film and/or substrate stresses can be reduced or eliminated through adjustment of thin-film fabrication process, it is desirable to monitor stress in a thin-film and its supporting substrate during the fabrication process. Current approaches to in-situ stress monitoring involve the use of laser-based optical systems that direct one or more laser beams towards the surface of the thin film being deposited on a substrate and measure beam deflection using precision-placed cameras/sensors. The measured relative displacement of the deflected beam is geometrically related to the stress-induced substrate curvature from which the stress can be calculated using the well-known Stoney equation. Unfortunately, there are two major drawbacks with these approaches. First, difficulties can be encountered for deflectometry measurement techniques when attempting to measure the stress in transparent films. Since the light is incident on the film side, destructive interference between the film and substrate can occur when the optical thickness of the film approaches a quarter of a wavelength of the incident laser light. If the reflected light received by the detectors is not of sufficient intensity, detectors can fail to track the signal and stall. Second, to avoid contamination of a vacuum deposition chamber required for thin-film fabrication, laser-based monitoring equipment is mounted outside of the deposition chamber and focused into the deposition chamber via optical windows built into the chamber walls. This leads to cost/size/complexity issues for in-situ stress monitoring.

SUMMARY OF THE INVENTION

Accordingly, it is an object of the present invention to provide a method and system that facilitates in-situ measurement of film and/or substrate stress occurring during thin-film fabrication.

Another object of the present invention is to provide for in-situ stress measurement during thin-film fabrication that has minimal or no impact on the thin-film fabrication process and systems.

Other objects and advantages of the present invention will become more obvious hereinafter in the specification and drawings.

In accordance with the present invention, a method and system are provided for determining mechanical stress experienced by a film being fabricated on a substrate. The substrate is positioned in a vacuum deposition chamber. The substrate has a first surface and a second surface opposing the first surface. The first surface is disposed to have a film deposited thereon and the second surface is a specular reflective surface. A portion of the substrate is supported. An optical displacement sensor is positioned in the vacuum deposition chamber in a spaced-apart relationship with respect to a portion of the substrate's second surface. A film is deposited on the substrate's first surface. During film deposition or thermal annealing processes, displacement of the portion of the substrate's second surface is measured using the optical displacement sensor. The measured displacement is indicative of a radius of curvature of the substrate, and the radius of curvature is indicative of mechanical stress being experienced by the film.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein:

FIG. 3 is an isolated plan view of a circular substrate supported at its periphery by discrete supports in accordance with an embodiment of the present invention;

FIG. 4 is an isolated plan view of a circular substrate supported at its periphery by a continuous annular support in accordance with another embodiment of the present invention;

Figure 6:
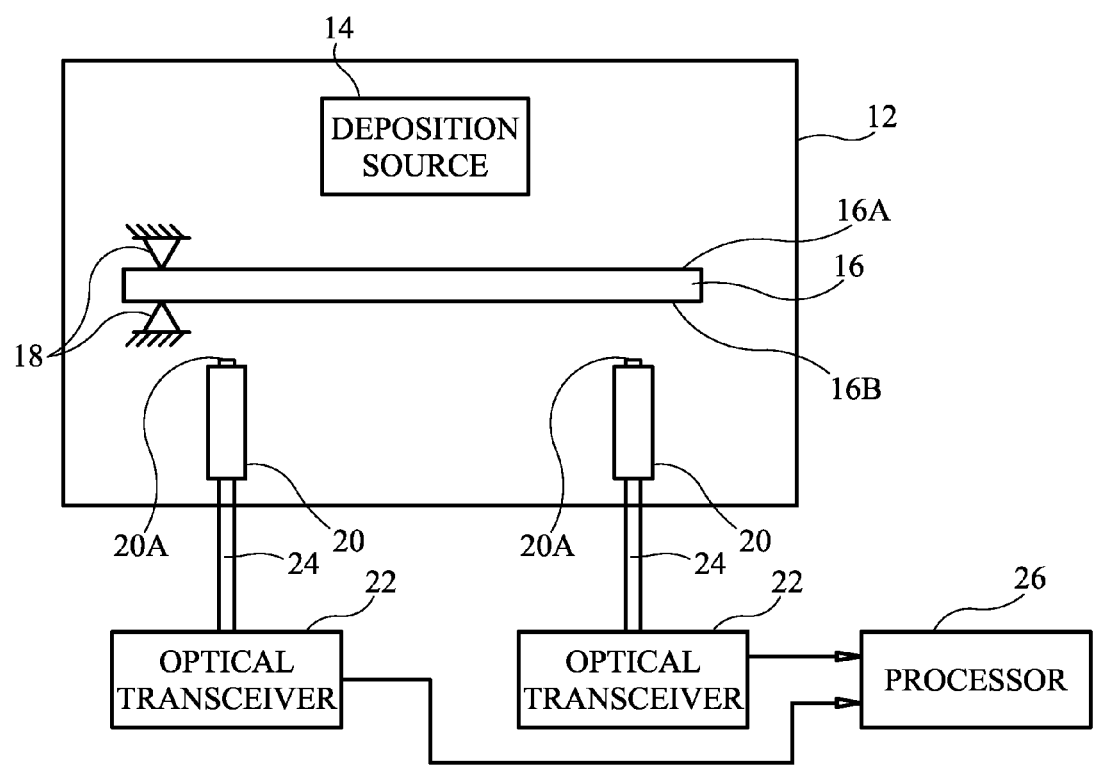

FIG. 5 is a schematic view of a system for depositing a film on a substrate while simultaneously measuring temperature of the substrate and determining mechanical stress experienced by the film in accordance with another embodiment of the present invention; and FIG. 6 is a schematic view of a system for depositing a film on a cantilevered substrate while determining mechanical stress experienced by the film in accordance with another embodiment of the present invention.

DESCRIPTION OF THE PREFERRED EMBODIMENT(S)

Figure 1:
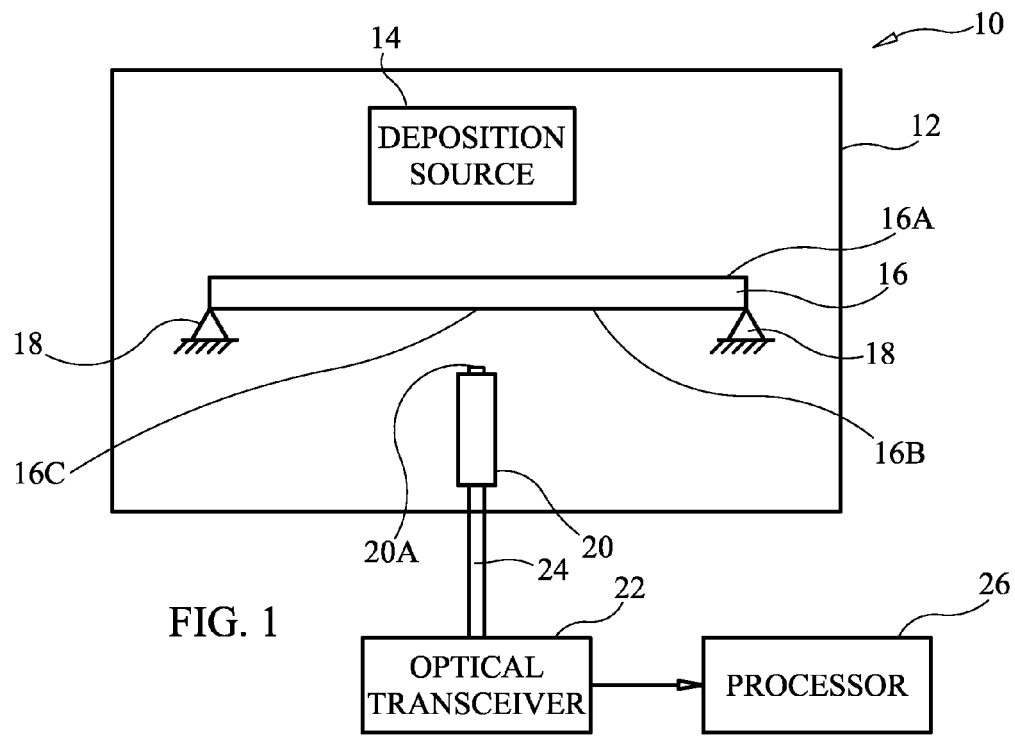
FIG. 1 is a schematic view of a system for depositing a film on a substrate while determining mechanical stress experienced by the film in accordance with an embodiment of the present invention.

Referring now to the drawings and more particularly to FIG. 1, a system for depositing a film on a substrate and simultaneously determining mechanical stress in the film in accordance with an embodiment of the present invention is shown and is referenced generally by numeral 10. As used herein, the terms "film" and "thin film" refer to films of one or more layers of material(s) being deposited onto a substrate material by known deposition processes to include, for example, physical vapor deposition, chemical vapor deposition, molecular beam epitaxy, and atomic layer deposition. While the choice of deposition system and process are not limitations of the present invention, the essential features of such known deposition systems will be described briefly herein.

System 10 includes an evacuated deposition chamber 12 housing a material deposition source 14 (e.g., a magnetron) that, when operated, will sputter out a selected material to form a film on a substrate 16.
In general, substrate 16 can be amorphous or crystalline and of a smooth surface quality common for thin-film deposition. Such substrate materials typically include crystalline silicon or glass. Ideally, the crystal orientation of the substrate should allow for a high degree of spherical symmetry under the action of uniform film stress. For example, many applications can utilize a crystalline silicon (111) or (001) wafer for substrate 16. Such silicon wafers are commercially available from a variety of sources.

Substrate 16 defines two planar and opposing surfaces 16A and 16B. Surface 16A faces deposition source 14 and surface 16A faces away from deposition source 14. For purposes of the present invention, surface 16B is polished or otherwise treated to define a surface that has good specular reflectivity. In accordance with an embodiment of the present invention, substrate 16 is in a substantially horizontal orientation. In a horizontal orientation, substrate 16 can be supported, but not constrained, in deposition chamber 12 on (but not affixed to) one or more supports 18 that lie on the circumference of a circle. As will be explained further below, support(s) 18 can be realized a plurality of discrete supports distributed about the circumference of a circle or by a single annular support that defines the circle of support. In either case, substrate 16 simply rests on support(s) 18 which can be located at the periphery of substrate 16 (e.g., in the case of a circular substrate as is generally the case for commercially-available silicon wafers), or within the confines of the periphery of a substrate without departing from the scope of the present invention. As will be explained further below, substrate 16 can be other geometric shapes (e.g., rectangular) and/or could be fixed (e.g., clamped) to one or more supports in other embodiments without departing from the scope of the present invention.

An optical displacement sensor such as a fiber optic displacement sensor 20 is positioned in deposition chamber 12. More specifically and for purposes of the present invention, a probe tip 20A of displacement sensor 20 is positioned in a spaced-apart relationship with a location 16C on surface 16B of substrate 16. While location 16C could be anywhere on surface 16B, mechanical-stress measurement sensitivity is maximized when location 16C is approximately the center of the support circle defined by support(s) 18 for reasons that will be explained further below. Displacement sensor 20 should be compatible with a vacuum environment. Such displacement sensors are available commercially from, for example, PhilTec Inc., Annapolis, Md.

Displacement sensor 20 transmits optical energy to surface 16B and receives reflected optical energy from surface 16B via probe tip 20A. The transmitted and received optical energy travels between probe tip 20A and an optical transceiver 22 via an optical fiber 24. The reflected optical energy can be provided to a processor 26 and used to determine mechanical stress in a film being deposited on surface 16A as will be explained further below. Optical transceiver 22 can be located outside of deposition chamber 12 so that only optical fiber 24 need transition the walls of deposition chamber 12. Prior to the start of the deposition process, displacement sensor 20 is calibrated by measuring the pre-process distance to location 16C. This calibrated distance defines the "zero" point from which deformation of the substrate/film will be measured.

Figure 2:
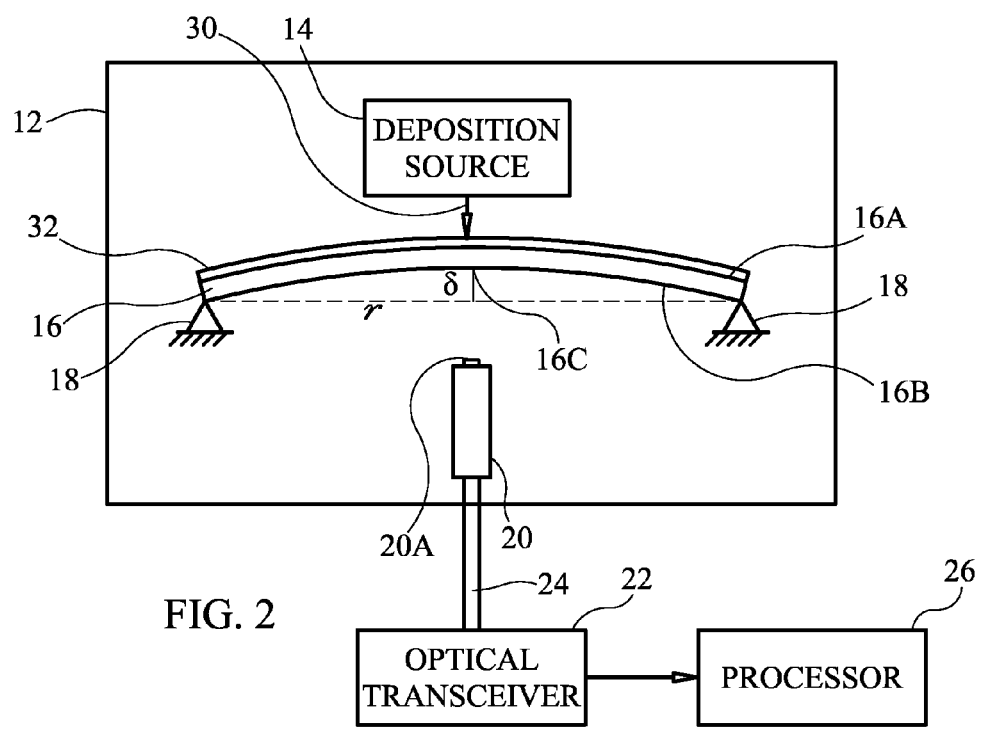
FIG. 2 is a schematic view of the system in FIG. 1 during the film deposition process illustrating spherical deformation of the substrate and film caused by mechanical stress during the film deposition process.

Referring now to FIG. 2, the process of thin-film deposition and simultaneous determination of mechanical stress experienced by thin-film will be explained. As mentioned above, when deposition source 14 is operated, material 30 sputtered from source 14 is deposited on surface 16A to form a film 32 thereon. It should be noted that the relative thickness of film 32 is exaggerated for purposes of illustration. During the deposition process, mechanical stresses in film 32 cause substrate 16 to deform. Since the support of substrate 16 is provided by a circular geometry, substrate 16/film 32 will experience spherical deformation for plane stress in the film and for a substrate of appropriate thickness, e.g., to form a concave spherical shape relative to probe tip 20A (as shown) or a convex spherical shape relative to probe tip 20A. As the deposition of film 32 and deformation of substrate 16/film 32 is occurring, optical transceiver 22 is operated to measure displacement of location 16C on surface 16A via optical energy transmission/reflection at probe tip 20A. The displacement of location 16C is used by processor 26 to determine mechanical stress experienced by film 32 as will now be explained.

The stress in film 32 results in a bending moment of substrate 16 causing a change of its curvature. From the measurement of this curvature, the plane stress in film 32 can be calculated using the well-known Stoney equation $$\sigma h_f = \frac{E_s h_s^2 \kappa}{6(1-\vartheta_s)}$$

which relates the stress force per unit width, $\sigma h_f$, to the substrate curvature, $\kappa$, through a proportionality constant described by the known geometric and mechanical properties of the substrate, namely, the substrate's thickness, $h_s$, and biaxial modulus, $$\frac{E_s}{(1-\vartheta_s)}.$$

The calculation of the in-situ film stress using the Stoney formalism relies on measurement of the relative change in substrate curvature during film deposition or thermal annealing of the deposited film.

For the case of a uniform, isotropic film, the deformation mode of a circular substrate is given by the parameter $$A = \sigma h_f \frac{D_s^2}{h_s^3}$$

where $D_s$ is the diameter of the substrate, $h_f$ is the thickness of the film, and $\sigma$ is the film stress. In particular and as is known in the art, the substrate deformation will be spherical and agree to within 90% of the Stoney equation provided the condition $A \leq 0.2\, A_c$ is satisfied (e.g., for a silicon substrate $A_c = 680$ GPa). For example, a silicon substrate with a 25 mm diameter and a thickness of 100 microns will deform spherically provided the force per unit width is less than 870 N/m. The maximum value of film stress for which this exemplary substrate's deformation will remain spherical for a 500 nm thick film would be approximately 1.7 GPa. For measurement of larger values of film stress, the condition ($A \leq 0.2\, A_c$) can be satisfied by increasing the thickness of the substrate. Curvature is constant for all points on a spherical surface and can be simply determined by measurement of its sagittal, i.e., the point of greatest deflection for the circularly-supported substrate/film or the center of the circular support in the present invention.

In the illustrated example, the curvature of the spherically-shaped substrate/film is calculated by the direct measurement of its sagittal, $\delta$, for a substrate-support circle of known radius, r, through the geometric relation $$\kappa = \frac{2\delta}{r^2 + \delta^2}$$

For small sagittal displacements where $\delta \ll r$, the Stoney equation (used to determine the mechanical stress) can be re-written in terms of $\delta$ as $$\sigma h_f = -\frac{1}{3}\frac{E_s}{(1-\vartheta_s)}\left(\frac{h_s}{r}\right)^2 \delta$$

As mentioned above, circular support of a substrate in the present invention can be provided by a singular annular support or by discrete supports. Accordingly, FIG. 3 illustrates an isolated plan view of surface 16B of circular substrate 16 with three discrete supports 18 located at the substrate's periphery. FIG. 4 illustrates an isolated plan view of a circular substrate 16 with a single/continuous annular ring support 18 at the substrate's periphery.

The system of the present invention can be readily adapted to monitor temperature of substrate 16 during film deposition. For example, FIG. 5 illustrates a thermocouple 28 mounted on (or possibly forming) one of discrete supports 18 such that it can monitor the temperature of substrate 16. Thermocouple 28 could be connected to processor 26 to collect temperature readings. By collecting substrate temperature data during film deposition, the present invention can aid in the explicit determination of temperature dependent stress related effects such as those affecting sensor 20, the substrate's support mechanism(s), etc.

Thin-film fabrication typically involves thermal annealing processing after a film is deposited on a substrate. Since such thermal annealing can also induce mechanical stress in the substrate/film, the present invention could also be used to determine the mechanical stresses during the thermal annealing phase of thin-film fabrication. Accordingly, FIG. 5 also illustrates a heat source 40 (e.g., a radiant heat source) in deposition chamber 12 that supplies the requisite heat for a thermal annealing process. Stress determination during this phase of thin-film fabrication proceeds as described above for the deposition phase.

The ambient environment can introduce thermal and/or vibrational loads on supports 18 that ultimately affect displacement of substrate 16 and measurements made by sensor 20. To improve measurement accuracy, it may be necessary to subtract out systematic errors caused by such thermal and/or vibrational loads. Accordingly, FIG. 5 also illustrates sensors 42 positioned adjacent to or coupled to supports 18 for measuring one or more of environmentally-induced thermal and vibrational load data affecting supports 18. Such measured data can be used by, for example, processor 26 to calculate systematic errors as part of the calibration process of sensor 20.

As mentioned above, the present invention is not limited to circular substrates or circularly-supported regions thereof. For example, FIG. 6 illustrates another embodiment of the present invention where substrate 16 (e.g., a rectangular substrate) is fixed/clamped along an edge thereof by/at support 18 such that substrate 16 is cantilevered in deposition chamber 12 over sensor(s) 20. In this embodiment, one or more displacement sensors 20 are focused on and spaced apart from surface 16B to measure deflection during deposition and/or annealing processes. Note that one sensor 20 could be positioned near support 18 where no deflection will occur to establish a reference measurement. During deposition on surface 16A, substrate 16 will deflect/curve towards sensor(s) 20 with the greatest amount of deflection occurring at the outboard end of substrate 16. While the mathematics for determining the radius of curvature of substrate 16 during deposition/annealing will be different than that described above for spherical deformation, the underlying principles for measuring radius of curvature are the same. The additional features described herein could also be included in this embodiment.

The advantages of the present invention are numerous. The disclosed optical measurement approach does not rely on reflection from the deposited film and, therefore, avoids the drawbacks associated with prior art approaches whose optical elements are focused on the deposited film. The sensor's probe tip in the present invention is protected (from film deposition) by the substrate. No optical windows are required in the deposition chamber as only a single optical fiber is transitioned into the deposition chamber. As a result, the present invention's in-situ thin-film stress measurement approach provides a new paradigm for thin-film fabrication adjustments that will ultimately lead to higher quality thin-film devices to include optical devices and semiconductors.

Although the invention has been described relative to specific embodiments thereof, there are numerous variations and modifications that will be readily apparent to those skilled in the art in light of the above teachings. For example, more than one optical displacement sensor could be used in cases where there is isotropy in the film. Furthermore, there can be relative motion between the substrate and the optical sensor's probe tip. For example, the substrate could be stationary or moved (e.g., rotated, moved linearly, etc.) during deposition and/or annealing without departing from the scope of the present invention. It is therefore to be understood that, within the scope of the appended claims, the invention may be practiced other than as specifically described.

What is claimed as new and desired to be secured by Letters Patent of the United States is:

1. A method of determining mechanical stress experienced by a film being fabricated on a substrate, comprising the steps of:
    providing a substrate in a vacuum deposition chamber, said substrate having a first surface and a second surface opposing said first surface wherein said first surface is disposed to have a film deposited thereon and wherein said second surface is a specular reflective surface;
    supporting a portion of said substrate along a circular geometry thereof, said circular geometry having a center;
    positioning an optical displacement sensor in said vacuum deposition chamber in a spaced-apart relationship with respect to a portion of said second surface located at approximately said center of said circular geometry;
    depositing a film on said first surface; and
    measuring, during said step of depositing, displacement of said portion of said second surface using said optical displacement sensor, wherein said displacement is indicative of a radius of curvature of said substrate, and wherein said radius of curvature is indicative of mechanical stress experienced by said film during said step of depositing.

2. A method according to claim 1, wherein said step of supporting is accomplished at discrete locations along said circular geometry.

3. A method according to claim 1, further comprising the step of measuring temperature of said substrate during said step of depositing.

4. A method according to claim 1, wherein said step of supporting is accomplished continuously along a perimeter of said portion of said substrate.

5. A method according to claim 1, wherein said substrate is a silicon wafer.

6. A method according to claim 1, wherein said substrate is a circular wafer.

7. A method according to claim 1, further comprising the step of calibrating said optical displacement sensor prior to said step of depositing.

8. A method according to claim 1, further comprising the steps of:
    annealing said film on said first surface; and
    measuring, during said step of annealing, displacement of said portion of said second surface using said optical displacement sensor, wherein said displacement is indicative of a radius of curvature of said substrate, and wherein said radius of curvature is indicative of mechanical stress experienced by said film during said step of annealing.

9. A method of determining mechanical stress experienced by a film being fabricated on a substrate, comprising the steps of:
    providing a circular, crystalline silicon wafer in a vacuum deposition chamber, said wafer having a first surface and a second surface opposing said first surface wherein said first surface is disposed to have a film deposited thereon and wherein said second surface is polished to define a specular reflective surface;
    supporting said wafer at a periphery thereof;
    positioning a probe tip of a fiber optic displacement sensor in said vacuum deposition chamber in a spaced-apart relationship with respect to a central portion of said second surface;
    depositing a film on said first surface; and
    measuring, during said step of depositing, displacement of said portion of said second surface using said fiber optic displacement sensor, wherein said displacement is indicative of a radius of curvature of said substrate, and wherein said radius of curvature is indicative of mechanical stress experienced by said film during said step of depositing.

10. A method according to claim 9, wherein said step of supporting is accomplished at discrete locations of said second surface.

11. A method according to claim 10, further comprising the step of measuring temperature of said wafer at one of said discrete locations during said step of depositing.

12. A method according to claim 9, wherein said step of supporting is accomplished continuously along said second surface at said periphery of said wafer.

13. A method according to claim 9, further comprising the step of calibrating said fiber optic displacement sensor prior to said step of depositing.

14. A method according to claim 9, further comprising the steps of:
    annealing said film on said first surface; and
    measuring, during said step of annealing, displacement of said portion of said second surface using said fiber optic displacement sensor, wherein said displacement is indicative of a radius of curvature of said substrate, and wherein said radius of curvature is indicative of mechanical stress experienced by said film during said step of annealing.

* * * * *